(12) United States Patent
Matsuzaki et al.

(10) Patent No.: US 8,680,766 B2
(45) Date of Patent: Mar. 25, 2014

(54) ORGANIC ELECTROLUMINESCENCE DISPLAY DEVICE AND MANUFACTURING METHOD THEREOF

(75) Inventors: Eiji Matsuzaki, Yokohama (JP); Yoshinori Ishii, Chiba (JP); Satoru Kase, Mobara (JP)

(73) Assignees: Japan Display Inc., Tokyo (JP); Panasonic Liquid Crystal Display Co., Ltd., Hyogo-Ken (JP)

( * ) Notice: Subject to any disclaimer, the term of this patent is extended or adjusted under 35 U.S.C. 154(b) by 393 days.

(21) Appl. No.: 12/264,942

(22) Filed: Nov. 5, 2008

(65) Prior Publication Data
US 2009/0115325 A1 May 7, 2009

(30) Foreign Application Priority Data

Nov. 6, 2007 (JP) .................. 2007-288956

(51) Int. Cl.
*H01L 51/50* (2006.01)
*H01L 51/52* (2006.01)
*H01L 51/56* (2006.01)
*C23C 16/00* (2006.01)

(52) U.S. Cl.
USPC ...... 313/509; 313/504; 313/506; 427/255.29; 427/255.31

(58) Field of Classification Search
USPC .......... 313/498–512; 445/24–25; 427/255.29, 427/255.31
See application file for complete search history.

(56) References Cited

U.S. PATENT DOCUMENTS

| 5,766,692 A | 6/1998 | Lee et al. |
| 7,538,354 B2 * | 5/2009 | Hayashi et al. ............ 257/79 |
| 2001/0004113 A1 | 6/2001 | Motomatsu |
| 2003/0077972 A1 | 4/2003 | Shiokawa et al. |

(Continued)

FOREIGN PATENT DOCUMENTS

| EP | 1 079 666 A2 | 2/2001 |
| JP | 02053242 A * | 2/1990 |

(Continued)

OTHER PUBLICATIONS

Communication mailed Sep. 25, 2012, in connection with Taiwanese Patent Application No. 097141881, 1 page.

*Primary Examiner* — Nimeshkumar Patel
*Assistant Examiner* — Jose M Diaz
(74) *Attorney, Agent, or Firm* — Antonelli, Terry, Stout & Kraus, LLP.

(57) ABSTRACT

An organic EL element section (1000) is formed on a circuit formation section (102) formed on a circuit board (101). The organic EL element section (1000) is covered with a protective layer (113) including an $SiN_xO_y$ film. The $SiN_xO_y$ film has infrared absorption characteristics including: an Si—O—Si stretching vibration absorption peak appearing at energy lower than 1,000 cm$^{-1}$; an absorption intensity of an Si—N stretching vibration absorption peak appearing in the vicinity of around 870 cm$^{-1}$ which is 0.75 or more times an absorption intensity of the Si—O—Si stretching vibration absorption peak; and an absorption peak intensity in a range of 2,000 to 4,000 cm$^{-1}$, which is 5% or less of the absorption intensity of the Si—N stretching vibration absorption peak. Thus, the protective film having an excellent moisture-blocking property may be obtained, and life property of an organic EL display device may be improved.

21 Claims, 10 Drawing Sheets

(56) References Cited

U.S. PATENT DOCUMENTS

| | | | |
|---|---|---|---|
| 2003/0164677 A1 | 9/2003 | Miyaguchi et al. | |
| 2005/0156519 A1 | 7/2005 | Yoshizawa et al. | |
| 2005/0238816 A1* | 10/2005 | Hou et al. | 427/569 |
| 2006/0028125 A1* | 2/2006 | Kim et al. | 313/504 |
| 2006/0062901 A1* | 3/2006 | Chou | 427/64 |
| 2006/0097628 A1* | 5/2006 | Suh et al. | 313/504 |
| 2006/0113894 A1* | 6/2006 | Fujii et al. | 313/499 |
| 2006/0192487 A1* | 8/2006 | Choi et al. | 313/512 |
| 2006/0202615 A1* | 9/2006 | Murakami et al. | 313/506 |
| 2006/0214586 A1* | 9/2006 | Kim | 313/586 |
| 2006/0244368 A1* | 11/2006 | Nagayama et al. | 313/504 |
| 2007/0013292 A1* | 1/2007 | Inoue et al. | 313/504 |
| 2007/0200491 A1* | 8/2007 | Seo et al. | 313/504 |

FOREIGN PATENT DOCUMENTS

| | | |
|---|---|---|
| JP | 08-111286 | 4/1996 |
| JP | 11-144864 | 5/1999 |
| JP | 2000-223264 | 8/2000 |
| JP | 2001-057287 | 2/2001 |
| JP | 2001-176655 | 6/2001 |
| JP | 2004-050821 | 2/2004 |
| JP | 2004-139977 | 5/2004 |
| JP | 2005-079254 | 3/2005 |
| JP | 2007-083493 | 4/2007 |
| TW | 580716 | 3/2004 |
| TW | 594619 | 6/2004 |
| TW | 200607386 | 2/2006 |

* cited by examiner

ORGANIC ELECTROLUMINESCENCE DISPLAY DEVICE AND MANUFACTURING METHOD THEREOF

CROSS-REFERENCE TO RELATED APPLICATION

The present application claims priority from Japanese application JP2007-288956 filed on Nov. 6, 2007, the content of which is hereby incorporated by reference into this application.

BACKGROUND OF THE INVENTION

1. Field of the Invention

The present invention relates to an organic electroluminescence (EL) display device, in particular, a reliable top emission type organic EL display device in which generation of a dark spot caused by moisture is suppressed, and a method of manufacturing the same.

2. Description of the Related Art

In an organic EL display device, an organic EL layer is sandwiched between a lower electrode (first electrode) and an upper electrode (second electrode), a constant voltage is applied to the upper electrode, and a data signal voltage is applied to the lower electrode so as to control light emission of the organic EL layer, thereby forming an image. Supply of data signal voltage to the lower electrode is carried out via a thin film transistor (TFT).

The light emitting property of an organic EL material used in the organic EL display device is degraded if moisture exists therein, and when an operation is performed for a long period of time, the organic EL material becomes unable to emit light at a place where the light emitting property has been degraded due to the moisture. The place appears as a dark spot of a display region. This dark spot grows with time, and becomes a defect in an image.

In order to prevent the generation or growth of the dark spot, it is necessary to prevent intrusion of moisture into the organic EL display device. Therefore, the organic EL layer formed on a device substrate is sealed to prevent the intrusion of moisture into the organic EL display device from outside. As for a sealing method for this purpose, various techniques have been developed.

JP 2001-57287 A and JP 2001-176655 A each disclose a basic structure for so-called "hollow sealing". In the structure disclosed in each of JP 2001-57287 A and JP 2001-176655 A, an organic EL layer is formed on a device substrate, and the device substrate is sealed with a sealing substrate in order to protect this organic EL layer. Further, the sealing substrate or the device substrate is provided with a drying agent, thereby removing moisture that has intruded. Besides, a space is formed between the device substrate and the sealing substrate.

The hollow sealing organic EL display device has problems such as the difficulty of adjusting a gap between the device substrate and the sealing substrate, the difficulty of adjusting pressure inside a sealed region, the contamination of an organic EL material due to gas emitted from a sealing agent when sealing with the sealing agent, and low throughput.

JP 8-111286 A and JP 2000-223264 A each disclose a structure for so-called "solid sealing" provided so as to cope with the problems of the above-mentioned hollow sealing. Specifically, JP 8-111286 A and JP 2000-223264 A each disclose a sealing structure provided by covering a device, on which an organic EL layer is formed, with an inorganic protective film or an organic protective film. However, the structure disclosed in each of JP 8-111286 A and JP 2000-223264 A has a problem in that a sealing effect against moisture is not sufficient as compared with a case where sealing is provided using a glass substrate or metal.

Other solid sealing structures include a structure disclosed in JP 2004-139977 A. JP 2004-139977 A discloses the structure in which a photo-curing resin formed on an optically transparent film is applied onto a device substrate, which is provided with an organic EL layer, with the use of a pressure roller heated to 80° C. Subsequently, the photo-curing resin is cured by ultraviolet radiation, and the optically transparent film is peeled off, thereby obtaining an organic EL display device sealed with the photo-curing resin. JP 2004-139977 A further discloses a structure in which an organic EL element is covered with a silicon nitride film as necessary.

JP 2005-79254 A discloses formation of an SiN film having lower Si—H with the use of plasma CVD. In the example disclosed in JP 2005-79254 A, a substrate temperature is 200° C. Moreover, JP 2004-50821 A discloses formation of an $SiN_xO_y$ film by ion plating.

SUMMARY OF THE INVENTION

Both in the hollow sealing and in the solid sealing, in order to further ensure protection of an organic EL layer against moisture, it is effective to further cover an upper electrode formed on the organic EL layer with SiN or the like. However, in the case of an SiN film that is normally used as a semiconductor protective film formed by a CVD method, if film formation is performed at a temperature as low as 100° C. or less (80° C. or less if possible) which is required for formation of a protective film for an organic EL display device, sufficient performance cannot necessarily be obtained because the hydrogen content is high and the density is low due to appearance of Si—H and N—H.

Moreover, because the film formation is performed at low temperature, foreign substances resulting from unreacted products are also likely to be generated. Besides, the temperature in the film formation process is likely to vary, and hence film quality significantly varies. The idea of increasing film thickness may be considered, but this idea is not realistic because the film formation rate is low, and in addition, the amount of equipment investment is increased.

Therefore, it is an object of the present invention to improve life property of an organic EL display device by obtaining a protective film having a high film formation rate and an excellent waterproof effect.

The present invention employs as a protective film a silicon oxynitride ($SiN_xO_y$) film having a high film formation rate, and determines a film formation condition for the $SiN_xO_y$ film, thereby obtaining the protective film having an excellent waterproof effect. Thus, an organic EL display device having excellent life property may be obtained. Specific means therefor are as follows.

(1) An organic EL display device including an organic EL element including a first electrode, an organic layer including a light emitting layer, and a second electrode, which are sequentially laminated above a first substrate having a circuit formed thereon, the organic EL element being covered with a protective layer including an $SiN_xO_y$ film, in which the $SiN_xO_y$ film is brought into contact with the second electrode, and in which the $SiN_xO_y$ film has infrared absorption characteristics including:

an Si—O—Si stretching vibration absorption peak appearing at energy lower than 1,000 cm$^{-1}$;

an absorption intensity of an Si—N stretching vibration absorption peak appearing in the vicinity of around 870 cm$^{-1}$, which is 0.75 or more times an absorption intensity of the Si—O—Si stretching vibration absorption peak; and an absorption peak intensity in a range of 2,000 to 4,000 cm$^{-1}$, which is 5% or less of an absorption intensity of the Si—N stretching vibration absorption peak.

(2) An organic EL display device according to item (1), in which the SiN$_x$O$_y$ film contains at least one material selected from the group consisting of Ar, Ne, and He.

(3) An organic EL display device according to item (1), in which the protective layer includes a magnesium oxide film laminated on the SiN$_x$O$_y$ film.

(4) An organic EL display device according to item (1), in which the protective layer includes a magnesium oxide film laminated on the SiN$_x$O$_y$ film, and another SiN$_x$O$_y$ film laminated on the magnesium oxide film.

(5) An organic EL display device according to item (3), in which the magnesium oxide film contains at least one material selected from the group consisting of Ar, Ne, and He.

(6) An organic EL display device according to item (3), in which a value determined by dividing an absorbance log (1/transmittance) at an O—H vibration absorption peak, which is observed in a range of 3,400 to 3,500 cm$^{-1}$ and in the vicinity of 3600 cm$^{-1}$ in an infrared absorption spectrum of the magnesium oxide film, by a film thickness of the magnesium oxide film is equal to or less than 0.08 μm$^{-1}$.

(7) An organic EL display device according to item (3), in which a value determined by dividing an absorbance log (1/transmittance) at an Mg—OH vibration absorption peak, which is observed in the vicinity of 3,700 cm$^{-1}$ in an infrared absorption spectrum of the magnesium oxide film, by a film thickness of the magnesium oxide film is equal to or less than 0.08 μm$^{-1}$.

(8) An organic EL display device according to item (3), in which the magnesium oxide film has a (111) crystalline orientation, and in an X-ray diffraction spectrum, a ratio between a (200) diffraction peak intensity I (200) and a (111) diffraction peak intensity I (111), i.e., I (200)/I (111), is equal to or less than 1.

(9) An organic EL display device according to item (3), in which the magnesium oxide film has an O/Mg ratio of equal to or more than 0.95 and equal to or less than 1.1.

(10) An organic EL display device including an organic EL element including a first electrode, an organic layer including a light emitting layer, and a second electrode, which are sequentially laminated above a first substrate having a circuit formed thereon, the organic EL element being covered with a protective layer including an SiN$_x$O$_y$ film, in which the SiN$_x$O$_y$ film is brought into contact with the second electrode, in which the SiN$_x$O$_y$ film has infrared absorption characteristics including:

an Si—O—Si stretching vibration absorption peak appearing at energy lower than 1,000 cm$^{-1}$;

an absorption intensity of an Si—N stretching vibration absorption peak appearing in the vicinity of around 870 cm$^{-1}$, which is 0.75 or more times an absorption intensity of the Si—O—Si stretching vibration absorption peak; and an absorption peak intensity in a range of 2,000 to 4,000 cm$^{-1}$, which is 5% or less of an absorption intensity of the Si—N stretching vibration absorption peak, and wherein the organic EL display device further comprises a resin sheet laminated on the protective layer, and a second substrate laminated on the resin sheet.

(11) An organic EL display device according to item (10), in which the resin sheet has a water-absorbing property.

(12) An organic EL display device including an organic EL element including a first electrode, an organic layer including a light emitting layer, and a second electrode, which are sequentially laminated above a first substrate having a circuit formed thereon, the organic EL element being covered with a protective layer including an SiN$_x$O$_y$ film, in which the SiN$_x$O$_y$ film is brought into contact with the second electrode, and the SiN$_x$O$_y$ film has infrared absorption characteristics including:

an Si—O—Si stretching vibration absorption peak appearing at energy lower than 1,000 cm$^{-1}$;

an absorption intensity of an Si—N stretching vibration absorption peak appearing in the vicinity of around 870 cm$^{-1}$, which is 0.75 or more times an absorption intensity of the Si—O—Si stretching vibration absorption peak; and an absorption peak intensity in a range of 2,000 to 4,000 cm$^{-1}$, which is 5% or less of an absorption intensity of the Si—N stretching vibration absorption peak, and in which the organic EL display device further includes a resin sheet laminated on the protective layer, the resin sheet is covered with a second substrate with a space interposed therebetween, and the space is filled with an inert gas.

(13) An organic EL display device according to item (12), in which the inert gas includes nitrogen.

(14) An organic EL display device according to item (12), further including a drying agent between the first substrate and the second substrate.

(15) An organic EL display device according to item (10), in which the second substrate is transparent with respect to visible light.

(16) An organic EL display device according to item (12), in which the second substrate is transparent with respect to visible light.

(17) A method of manufacturing an organic EL display device including an organic EL element including a first electrode, an organic layer including a light emitting layer, and a second electrode, which are sequentially laminated above a first substrate having a circuit formed thereon, the organic EL element being covered with a protective layer including an SiN$_x$O$_y$ film, the method including irradiating a material made of a silicon oxide with an ion beam in an atmosphere containing at least one material selected from the group consisting of Ar, Ne, He and H$_2$, and a nitrogen compound gas, to form the SiN$_x$O$_y$ film.

(18) A method of manufacturing an organic EL display device including an organic EL element including a first electrode, an organic layer including a light emitting layer, and a second electrode, which are sequentially laminated above a first substrate having a circuit formed thereon, the organic EL element being covered with a protective layer including an SiN$_x$O$_y$ film and a magnesium oxide film, the method including irradiating a material made of a magnesium oxide with one of an ion beam and an electron beam in an atmosphere containing an oxygen compound gas to form the magnesium oxide film.

According to the present invention, as the protective film for the organic EL display device, it is possible to obtain the SiN$_x$O$_y$ film which may be formed by low temperature film formation, and in which foreign substances resulting from unreacted products are few, and the hydrogen content is low and the density is high as compared with a film formed by a CVD method. Accordingly, it is possible to improve a barrier property against moisture, and to realize a long lifetime of the organic EL display device. Further, with the combined use of magnesium oxide, the protective film is allowed to have a higher moisture-proof effect.

Since a reactive plasma deposition (RPD) method and a sputtering method may be applied, the use of an evaporation mask for a panel terminal section is enabled. Further, since the need for semiconductor gas introduction equipment and waste gas processing equipment is eliminated, the equipment cost may be reduced. Accordingly, the cost of forming the protective film in the organic EL display device may be reduced.

DETAILED DESCRIPTION OF THE INVENTION

Organic EL display devices are classified into: a bottom emission type organic EL display device in which light emitted from an organic EL layer is taken out in the direction of a glass substrate on which the organic EL layer and the like are formed; and a top emission type organic EL display device in which light emitted from an organic EL layer is taken out in the direction opposite to a glass substrate on which the organic EL layer and the like are formed. The present invention may be applied to both types of the organic EL display devices.

Hereinafter, the present invention is described in detail by way of embodiments of the present invention.

Embodiment 1

Figure 1:
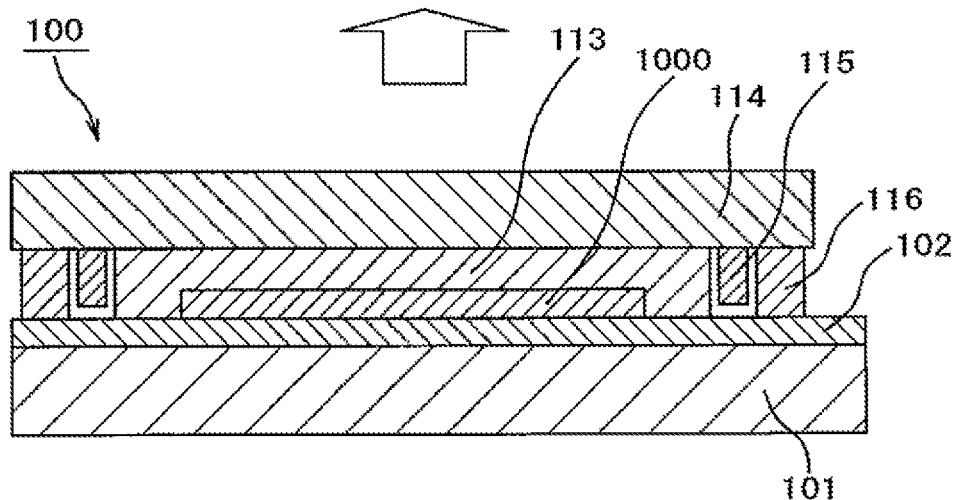
FIG. 1 is a cross-sectional view illustrating an organic EL display device according to Embodiment 1.

FIG. 1 is a cross-sectional view illustrating a main portion of an organic EL panel 100. In FIG. 1, the organic EL panel 100 includes: a circuit board 101 including a glass substrate; a circuit formation section 102 such as a thin film transistor (TFT); an organic EL element section 1000 having an organic EL element formed thereon; a protective film 113 formed so as to cover the organic EL element section 1000; a sealing glass 114; a drying agent 115; and a sealing agent 116. The outline arrow indicates a direction of light emission, and in a case of this embodiment, light is to be taken out from the sealing glass 114 side.

The organic EL element section 1000 is sealed with the sealing glass 114, the protective film 113, the sealing agent 116, and the circuit board 101 including the circuit formation section 102. An organic film made of acrylic, polyimide or the like, or an inorganic insulating film such as an Si oxide film or an Si nitride film is formed as a planarizing layer on the circuit formation section 102 in accordance with the surface irregularity thereof. The protective film 113 and the sealing glass 114 are brought into contact with each other.

The present invention is particularly pertains to the protective film 113, and the film structure of the protective film 113 and the quality of films constituting the protective film 113 are determined so as to be capable of preventing property degradation of the organic EL panel 100 caused by intrusion of moisture or oxygen. Accordingly, if the property degradation of the organic EL panel 100 caused by intrusion of moisture or oxygen may be prevented only by the protective film 113 and the sealing agent 116, the drying agent 115 is not necessarily required.

Further, according to this embodiment, since the sealing glass 114 is retained by the protective film 113, it is possible to prevent generation of a black spot resulting from accidental contact of the sealing glass 114 with the organic EL element section 1000. Moreover, if a gap between the circuit board 101 and the sealing glass 114 may be controlled with the protective film 113, and if the property degradation of the organic EL panel 100 caused by intrusion of moisture or oxygen may be prevented only by the protective film 113, the drying agent 115 and the sealing agent 116 are not necessarily required.

Figure 2:
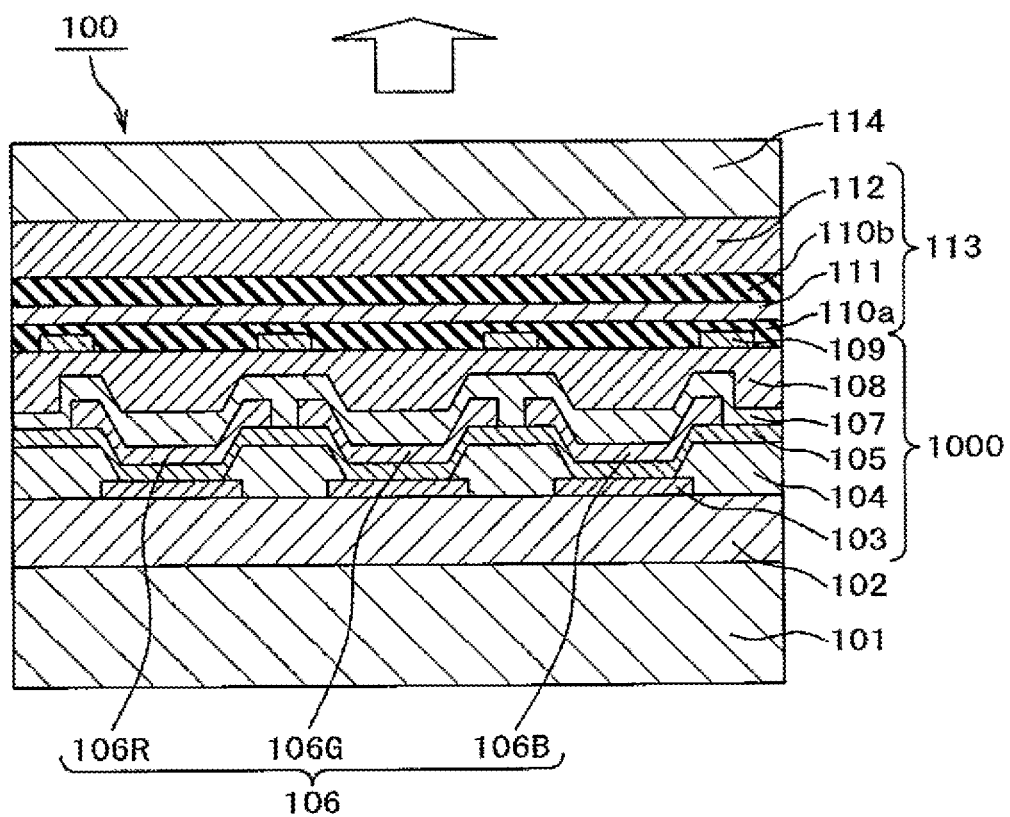
FIG. 2 is a cross-sectional view illustrating a display region of the organic EL display device according to Embodiment 1.

FIG. 2 is a cross-sectional view illustrating a main portion of the organic EL panel 100, in which the organic EL element section 1000 is enlarged. The details of Embodiment 1 are described with reference to FIG. 2. In FIG. 2, the organic EL panel 100 includes: a first electrode 103 (lower electrode serving as cathode or anode) formed on the circuit formation section 102; a bank 104 provided so as to cover a pattern end of the first electrode 103; organic layers 105 to 107; a second electrode 108 (upper electrode serving as anode or cathode); an auxiliary electrode 109; $SiN_xO_y$ films 110a and 110b; a magnesium oxide film 111; and a resin sheet 112. The organic EL element section 1000 includes the first electrode 103, the organic layers 105 to 107, and the second electrode 108.

Since light emitted from the organic EL panel 100 is taken out from the sealing glass 114 side, the first electrode 103 serves as a reflecting electrode, and includes a metal film of Al or the like, or a multilayer film of the metal film and a transparent ITO film. The bank 104 is provided in order to prevent a short-circuit between the first electrode 103 and the second electrode 108, and includes an Si-containing insulating film such as an $SiN_x$ film, an $SiO_x$ film or an $SiN_xO_y$ film, or an organic film such as an acrylic film or a polyimide film.

The organic layer 106 includes light emitting layers, and emits light from these portions. In FIG. 2, the organic layer 106 includes a red light emitting layer 106R, a green light emitting layer 106G, and a blue light emitting layer 106B. If necessary, the organic layer 106 includes a blocking layer against holes, and/or a transport layer (hole transport layer, and/or electron transport layer).

The organic layer 105 and the organic layer 107 each include at least one of a transport layer (hole transport layer or electron transport layer) and an injection layer (hole injection layer or electron injection layer).

Light emitted from the organic EL panel 100 is taken out from the sealing glass 114 side, and hence the second electrode 108 serves as a transparent electrode, and includes an ITO film, an IZO film and/or a ZnO film. When the cavity effect of the organic EL element is enhanced, an Ag translucent film also serving as a reflecting electrode is used.

The auxiliary electrode 109 is provided in order to prevent a defect such as uneven brightness, which is caused by a voltage drop due to high resistance of the second electrode 108. Accordingly, when the voltage drop of the second electrode 108 is small, no trouble occurs even if the auxiliary electrode 109 is omitted.

The protective film 113 described with reference to FIG. 1 is formed by a multilayer film of the $SiN_xO_y$ film 110a, the magnesium oxide film 111, the $SiN_xO_y$ film 110b, and the resin sheet 112. The present invention is applied to this portion.

Figure 3A:
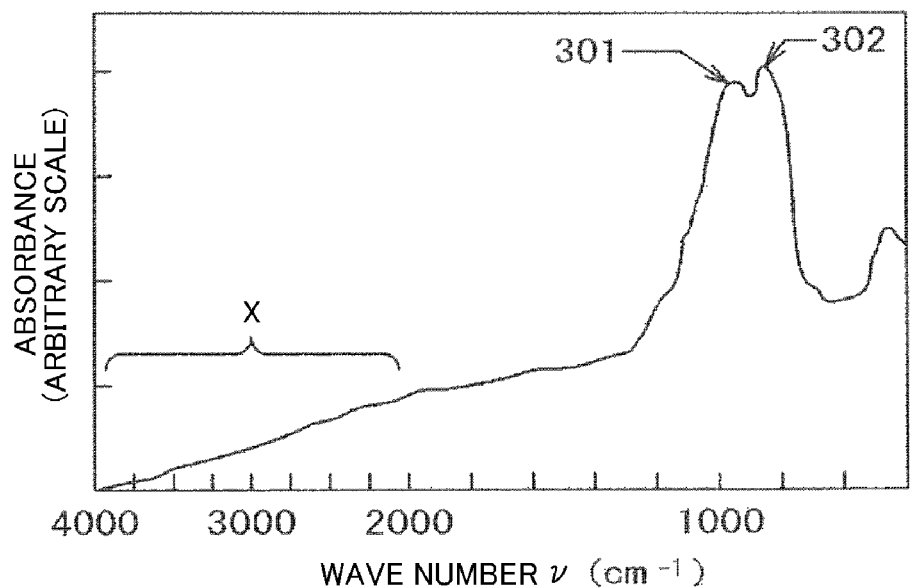
FIGS. 3A and 3B are graphs each showing an infrared absorption curve of an $SiN_xO_y$ film.

FIG. 3A shows an infrared absorption spectrum of the $SiN_xO_y$ films 110a and 110b according to this embodiment. An infrared absorption curve of FIG. 3A shows an Si—O stretching vibration absorption peak 301, and an Si—N stretching vibration absorption peak 302. It is distinctive that no absorption peak is observed at energy higher than 2,000 $cm^{-1}$, which is indicated by X of FIG. 3A. Further, an absorbance at the Si—N stretching vibration absorption peak 302 is at substantially the same level as an absorbance at the Si—O stretching vibration absorption peak 301. Those show that the film density of the $SiN_xO_y$ film is high, and nitridation has proceeded to decrease unreacted Si.

Even in the case where an absorption peak appears at energy higher than 2,000 $cm^{-1}$, there is no problem as long as this absorption peak is 5% or less of the Si—O stretching vibration absorption peak 301. An absorption peak within an energy range from 2,000 $cm^{-1}$ to 4,000 $cm^{-1}$ is due to Si—H, and it is experimentally demonstrated that the property of blocking moisture is sufficiently obtained as long as the appearance of Si—H is 5% or less of the appearance of Si—O.

In the case of an $SiN_x$ film or an $SiN_xO_y$ film formed by a plasma CVD method that has been conventionally used, an absorption peak reflecting moisture storage or hydroxide formation, or an absorption peak of Si or N and H is observed in this region. Therefore, the density of the $SiN_x$ film or the $SiN_xO_y$ film is reduced, and the barrier property against moisture or the like is degraded. In particular, if the film formation is performed at temperature as low as 100° C. or less, the degradation in quality of the resulting film is increased, which also causes a problem in that foreign substances resulting from unreacted substances are generated. In recent years, a high-density film, in which no absorption peak is observed at energy higher than 2,000 $cm^{-1}$ even in low temperature film formation, has been supposed to be obtained by performing a CVD method using ECR plasma or ICP plasma, but it is difficult to lower the film formation temperature below 200° C.

Thus, it can be seen that the $SiN_xO_y$ film according to this embodiment has a higher density and a higher barrier property against moisture or oxygen than those of the $SiN_x$ film or $SiN_xO_y$ film that has been conventionally used.

Figure 3B:
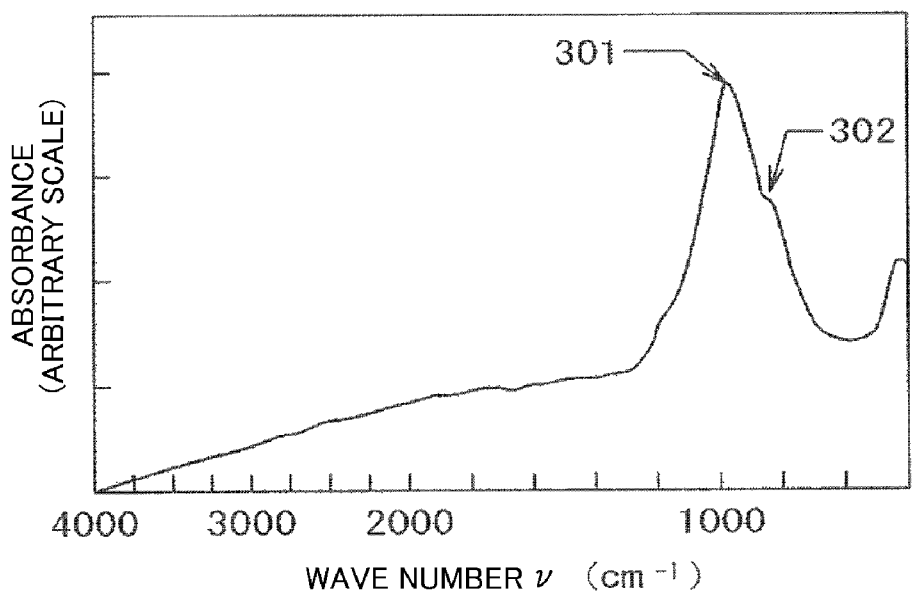

As means for forming an $SiN_xO_y$ film, JP 2004-50821 A proposes ion plating performed using silicon oxide (SiO) as an evaporation source. In the proposed method, the film may be formed at rate as high as 100 nm/min or more, but no disclosure is made about the film quality. According to the experiment carried out by the inventors of the present invention, the infrared absorption spectrum shown in FIG. 3B is often obtained in the $SiN_xO_y$ film formed by this method. It can be seen from FIG. 3B that no absorption peak is observed at energy higher than 2,000 $cm^{-1}$. However, the Si—O stretching vibration absorption peak 301 appears at energy higher than 1,000 $cm^{-1}$, and an absorbance at the Si—N stretching vibration absorption peak 302 is as low as less than 75% of an absorbance at the Si—O stretching vibration absorption peak 301. This suggests that nitridation has not proceeded, and Si is excessive. It is found that such a film often exhibits a large compression film stress, and it is difficult to use this film as a protective film for an organic EL element.

To the contrary, in the present invention, an activated reactive evaporation CVD method is used, thereby making it possible to form, as a protective film for an organic EL display device, an $SiN_xO_y$ film having the following characteristics:

(1) An Si—O—Si stretching vibration absorption peak appears at energy lower than 1,000 $cm^{-1}$;

(2) An absorption intensity of an Si—N stretching vibration absorption peak appearing in the vicinity of around 870 $cm^{-1}$ is more than 0.75 times an absorption intensity of the Si—O—Si stretching vibration absorption peak; and (3) An absorption peak intensity in the range of 2,000 to 4,000 $cm^{-1}$ is 5% or less of the absorption intensity of the Si—N stretching vibration absorption peak.

By providing the film having such characteristics, it is possible to obtain a protective film that is formed at high rate, has a high film density, and has a low film stress. The film stress may be reduced due to the above-mentioned conditions (1) and (2), and the concentration of Si—H may be decreased due to the condition (3), and therefore, the protective film having a high film density may be obtained.

The protective film 113 according to this embodiment has structure in which the magnesium oxide film 111 is sandwiched between the $SiN_xO_y$ films each having a high film density. This is because, if a defect such as a pin hole is generated in the $SiN_xO_y$ film, moisture intruding into the organic EL element section therethrough is absorbed since magnesium oxide has a water-absorbing property. Thus, the moisture barrier property of the protective film 113 is considerably improved. The magnesium oxide film 111 is not brought into direct contact with the organic EL element section 1000 because the organic layer 107 in contact with the second electrode 108 of the organic EL element may have a water-absorbing property. The $SiN_xO_y$ film 110b is laminated on the magnesium oxide film 111 in order to reduce the amount of moisture to be absorbed by the magnesium oxide film 111, and to prolong the water-absorbing capability thereof. Thus, the film thickness of each $SiN_xO_y$ film used for the protective film 113 may be reduced. This leads to the downsizing of the film formation equipment for the $SiN_xO_y$ films, and can contribute to the manufacturing cost reduction.

Accordingly, if the number of pin holes is small in the $SiN_xO_y$ film used for the protective film 113 and there is no problem with the lifetime of the organic EL panel 100, there is no need to use the magnesium oxide film 111, and at least one $SiN_xO_y$ film may be used.

Figure 4A:
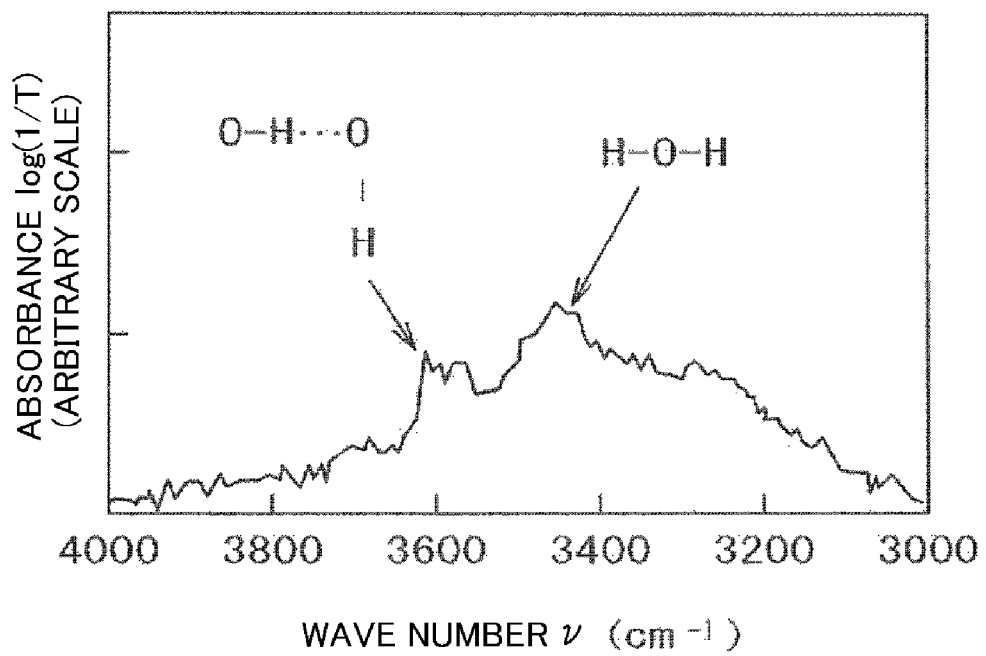
FIGS. 4A and 4B are graphs each showing an infrared absorption characteristic of MgO.
Figure 4B:
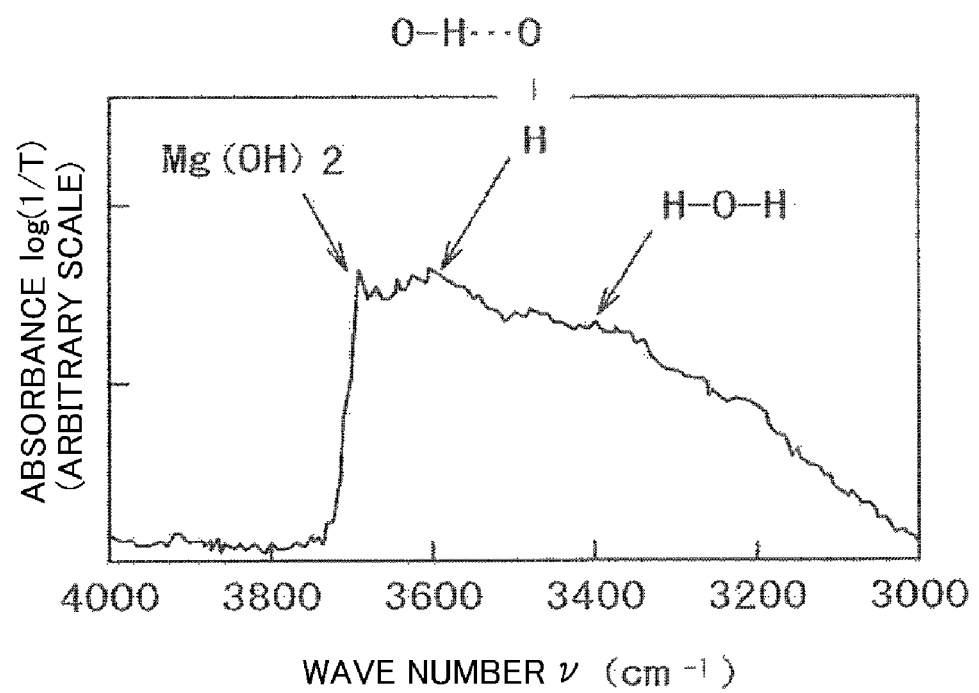

The magnesium oxide used in this embodiment preferably has a high water-absorbing property, and it is recommended that, in the infrared absorption characteristics shown in FIGS. 4A and 4B, an absorption peak related to moisture storage and appearing in the range of 3000 cm$^{-1}$ to 4,000 cm$^{-1}$ is low. In other words, it is preferable to satisfy the following conditions:

(1) A value determined by dividing an absorbance log (1/T; transmittance) at an O—H vibration absorption peak, observed in the range of 3,400 cm$^{-1}$ to 3,500 cm$^{-1}$ and in the vicinity of 3600 cm$^{-1}$ in an infrared absorption spectrum of the magnesium oxide film, by the film thickness of the magnesium oxide film is equal to or lower than 0.08 μm$^{-1}$; and (2) A value determined by dividing an absorbance log (1/T; transmittance) at an Mg—OH vibration absorption peak, observed in the vicinity of 3,700 cm$^{-1}$ in an infrared absorption spectrum of the magnesium oxide film, by the film thickness of the magnesium oxide film is equal to or lower than 0.08 μm$^{-1}$.

Moreover, since the film composition (O/Mg ratio) also varies depending on the water-absorbing state, it is preferable to form the magnesium oxide film so that the O/Mg ratio falls within the range of 0.95 to 1.1.

Figure 5A:
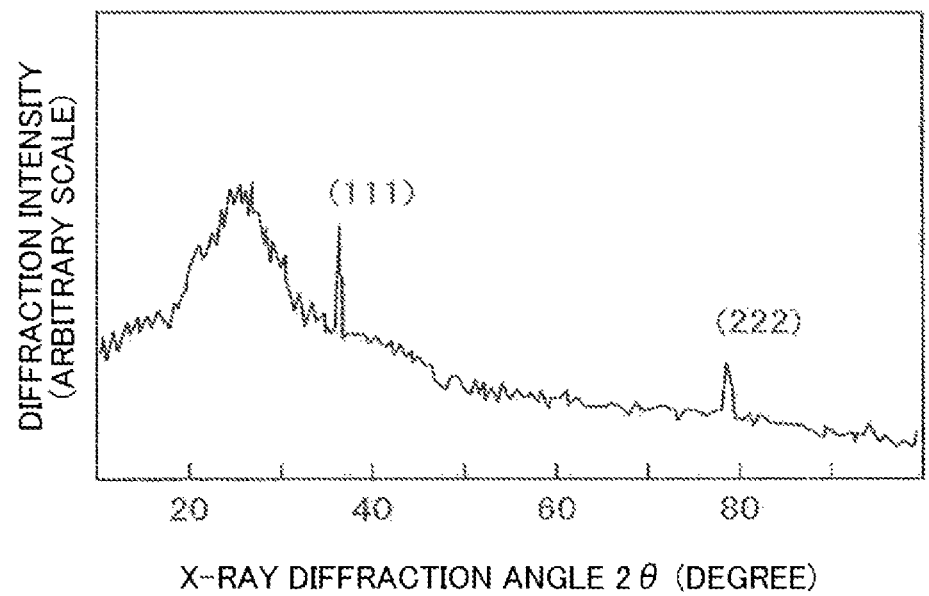
FIGS. 5A and 5B are graphs each showing an X-ray diffraction characteristic of MgO.
Figure 5B:
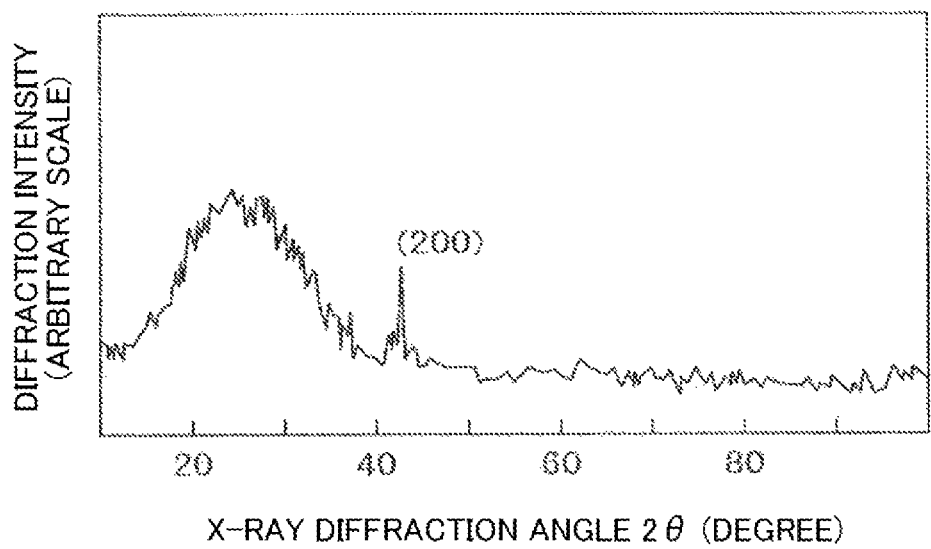

Further, in order to maintain the barrier property against moisture, intruding into the organic EL element side through the magnesium oxide film, for a long time, it is preferable that the magnesium oxide film has a (111) orientation shown in FIGS. 5A and 5B. This is because the film density of the magnesium oxide film may be increased.

Figure 6:
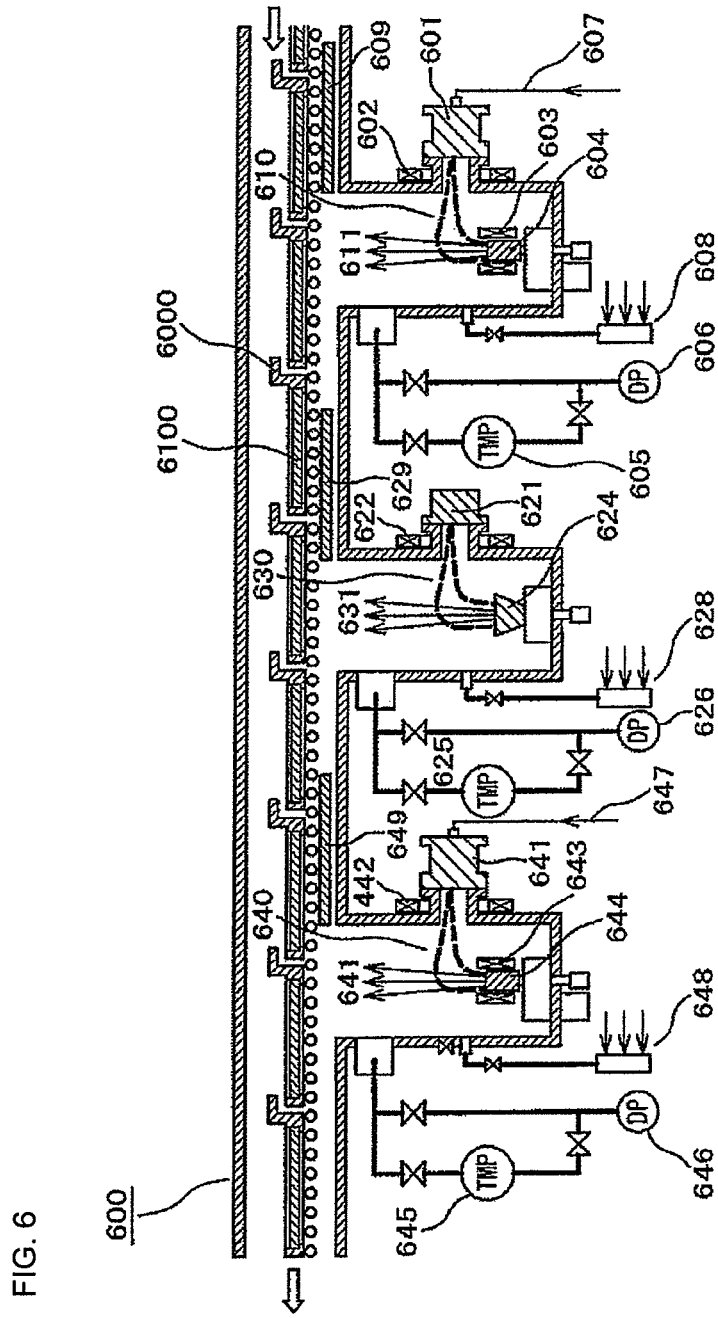
FIG. 6 is a diagram illustrating equipment for manufacturing a protective film.

FIG. 6 illustrates an outline of a film formation apparatus for forming an SiN$_x$O$_y$/MgO/SiN$_x$O$_y$ multilayer film according to this embodiment. An SiN$_x$O$_y$ film is formed as follows. In an atmosphere containing a nitrogen compound gas (such as N$_2$ or NH$_3$), oxygen-deficient silicon oxide (SiO$_x$, x≈1) evaporation sources 604 and 644 are irradiated with Ar ion beams 610 and 640, respectively, and evaporated particles 611 and 641 are deposited on an organic EL substrate motherboard 6100 accommodated in a substrate tray 6000, thus forming the SiN$_x$O$_y$ film. An Ar gas used to produce the Ar ion beams 610 and 640 is introduced through inert gas supply lines 607 and 647, and the nitrogen compound gas (such as N$_2$ or NH$_3$) serving as a reactive gas is introduced through reactive gas supply systems 608 and 648.

A magnesium oxide film is formed as follows. In an atmosphere containing an oxygen compound gas (such as O$_2$, N$_2$O or CO$_2$), an MgO evaporation source 624 is irradiated with an electron beam 630, and evaporated particles 631 are deposited on the organic EL substrate motherboard 6100 accommodated in the substrate tray 6000, thus forming the magnesium oxide film. The oxygen compound gas (such as O$_2$, N$_2$O or CO$_2$) serving as a reactive gas is introduced through a reactive gas supply system 628.

This film formation apparatus can form an SiN$_x$O$_y$/MgO/SiN$_x$O$_y$ multilayer film by moving the substrate tray 6000 in which the organic EL substrate motherboard 6100 is accommodated. Between the organic EL substrate motherboard 6100 and the substrate tray 6000, an evaporation mask is inserted, and hence no film is formed at a connecting terminal with an external circuit of an organic EL panel. By setting the film thickness of the SiN$_x$O$_y$ film at 200 nm or less, the temperature of the organic EL substrate motherboard 6100 may be maintained at 80° C. or lower. The film thickness of the magnesium oxide film may be appropriately set in view of the water-absorbing property thereof. The SiN$_x$O$_y$ film produced by this method contains Ar that forms ions. An Ar ion beam is used in this embodiment, but the present invention is not limited to this, and no trouble occurs even if other inert gases are used. In such a case, these inert gases are contained in the film. It should be noted that the magnesium oxide film is formed by an electron beam vapor deposition method performed in the reactive atmosphere, but, similarly to the case of the SiN$_x$O$_y$ film, the magnesium oxide film may be formed by irradiating the MgO evaporation source with an ion beam including an inert gas in an atmosphere containing an oxygen compound gas (such as O$_2$, N$_2$O or CO$_2$). In such a case, the inert gas will also be contained in the magnesium oxide film.

In the film formation method used in this embodiment, the SiN$_x$O$_y$ film may be obtained at a film formation rate of 100 nm/min or more, which can contribute to reduction in manufacturing equipment. Due to these merits, the effect of reducing the cost price of an organic EL panel is produced.

In this embodiment, the protective film 113 is provided by laminating the resin sheet 112 on the multilayer film including the SiN$_x$O$_y$ films and the magnesium oxide film. Thus, a flat glass, on which no cavity processing or the like is performed, may be used as the sealing glass 114. As the resin sheet 112, a transparent acrylic or the like may be used. Moreover, a water-absorbing property may be imparted to the resin sheet 112 so that the resin sheet 112 also serves as a drying agent. Since the resin sheet 112 functions are similar to a sealing agent, the effect of increasing the thickness of the sealing agent is equivalently obtained, and the barrier property against moisture intruding into the organic EL element section 1000 is improved.

As described above, according to this embodiment, the organic EL panel having a high barrier property against moisture or oxygen and a long lifetime may be provided. Further, the generation of a black spot caused by deflection of the sealing glass can also be prevented.

Embodiment 2

Figure 7:
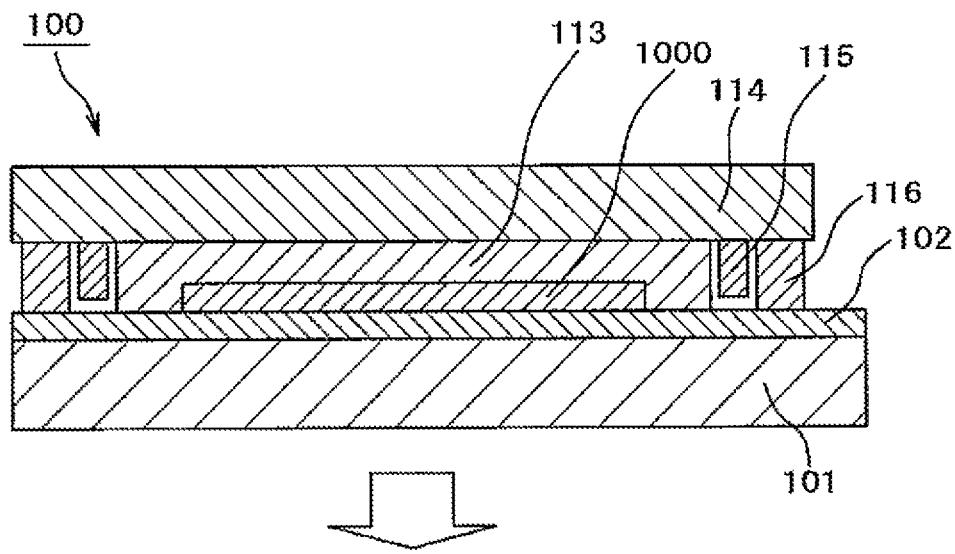
FIG. 7 is a cross-sectional view illustrating an organic EL display device according to Embodiment 2.

This embodiment provides an example of application of the present invention to a bottom emission type organic EL panel, and is similar to Embodiment 1 except for this point. FIG. 7 is a cross-sectional view illustrating a main portion of an organic EL panel 100. In FIG. 7, the organic EL panel 100 includes: a circuit board 101 such as a glass substrate; a circuit formation section 102 including a thin film transistor (TFT); an organic EL element section 1000 having an organic EL element formed thereon; a protective film 113 formed so as to cover the organic EL element section 1000; a sealing glass 114; a drying agent 115; and a sealing agent 116. The outline arrow indicates a direction of light emission, and in a case of this embodiment, light is to be taken out from the circuit board 101 side. The organic EL element section 1000 is sealed with the sealing glass 114, the protective film 113, the sealing agent 116, and the circuit board 101 including the circuit formation section 102.

Figure 8:
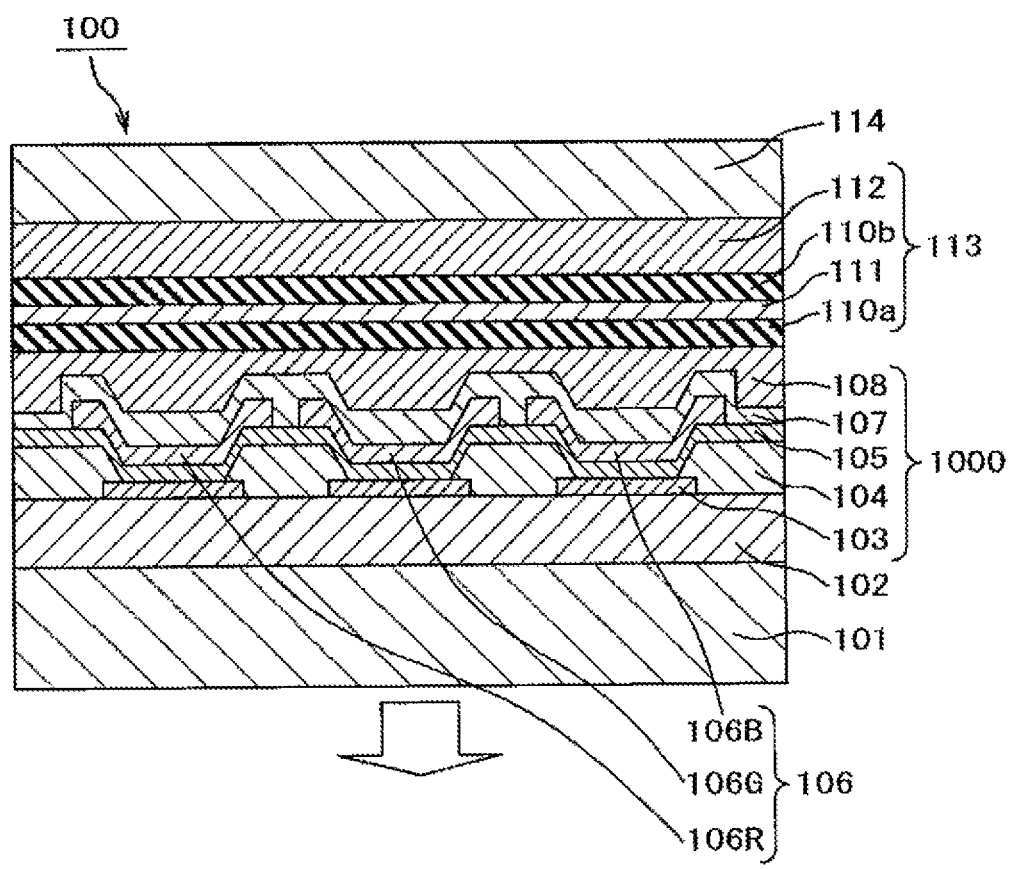
FIG. 8 is a cross-sectional view illustrating a display region of the organic EL display device according to Embodiment 2.

FIG. 8 is a cross-sectional view illustrating a main portion of the organic EL panel 100, in which the organic EL element section 1000 is enlarged. FIG. 8 illustrates the first electrode 103 (lower electrode serving as cathode or anode) formed on the circuit formation section 102, the bank 104 provided so as to cover a pattern end of the first electrode 103, the organic layers 105 to 107, the second electrode 108 (upper electrode serving as anode or cathode), the SiN$_x$O$_y$ films 110a and 110b, the magnesium oxide film 111, and the resin sheet 112. The organic EL element section 1000 includes a first electrode 103, organic layers 105 to 107, and a second electrode 108.

Light emitted from the organic EL panel 100 is taken out from the circuit board 101 side, and hence the first electrode 103 serves as a transparent electrode, and includes an ITO film, an IZO film and/or a ZnO film. For the second electrode 108, a metal film of Al or the like is used in order to allow the second electrode 108 to function as a reflecting electrode. Therefore, there is no need to provide any auxiliary electrode. This embodiment differs in this point from Embodiment 1.

Accordingly, the protective film 113 described with reference to FIG. 7 is formed by a multilayer film of the SiN$_x$O$_y$ film 110a, the magnesium oxide film 111, the SiN$_x$O$_y$ film 110b and the resin sheet 112, and this embodiment is also similar to Embodiment 1 in that the present invention is applied to this portion.

Also in this embodiment, the effects similar to those of Embodiment 1 may be obtained.

Embodiment 3

Figure 9:
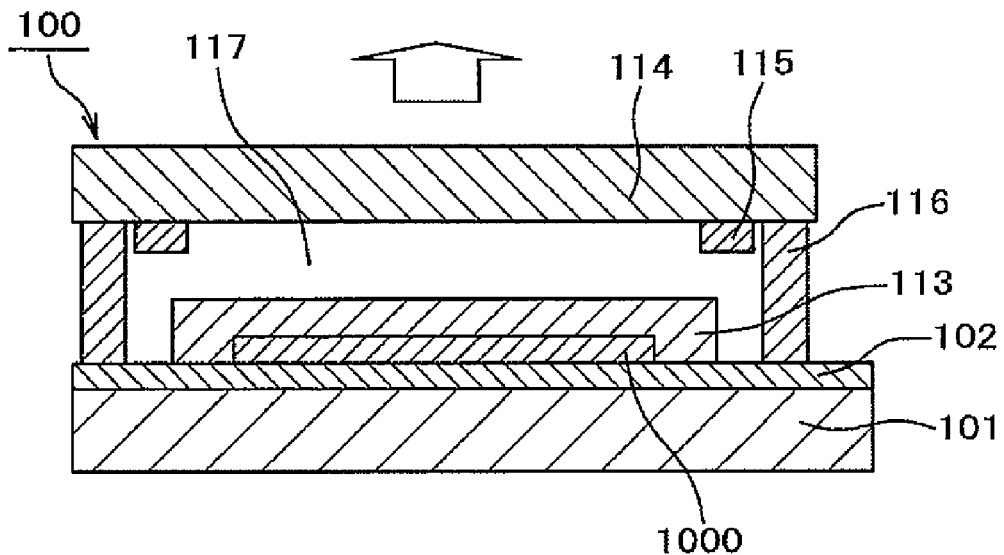
FIG. 9 is a cross-sectional view illustrating an organic EL display device according to Embodiment 3.

This embodiment provides an example of application of the present invention to an organic EL panel in which hollow sealing is provided, and is similar to Embodiment 1 except for this point. FIG. 9 is a cross-sectional view illustrating a main portion of an organic EL panel 100. In FIG. 9, the organic EL panel 100 includes a circuit board 101 such as a glass substrate; a circuit formation section 102 including a thin film transistor (TFT); an organic EL element section 1000 having an organic EL element formed thereon; a protective film 113 formed so as to cover the organic EL element section 1000; a sealing glass 114; a drying agent 115; and a sealing agent 116.

In a case of this embodiment, a sealing space 117 is newly formed between the sealing glass 114 and the protective film 113. This embodiment differs in this point from Embodiment 1, and is similar in other points to Embodiment 1. The outlinear row indicates a direction of light emission, and in the case of this embodiment, light is to be taken out from the sealing glass 114 side.

Figure 10:
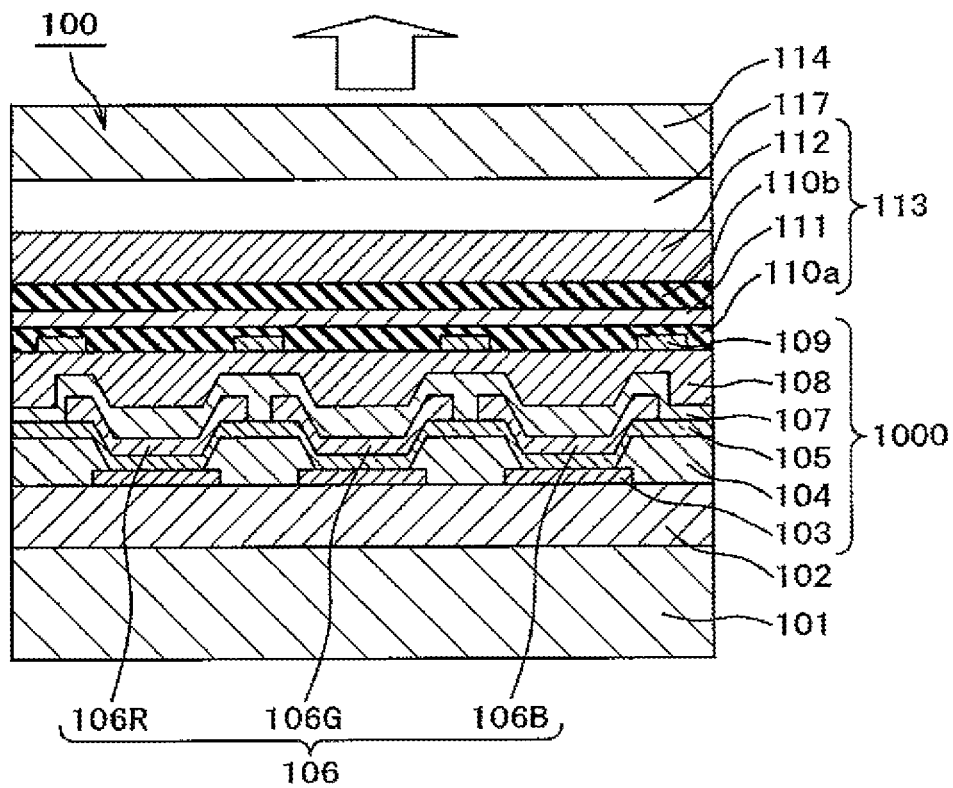
FIG. 10 is a cross-sectional view illustrating a display region of the organic EL display device according to Embodiment 3.

The organic EL element section 1000 is sealed with the sealing glass 114, the protective film 113, the sealing agent 116, and the circuit board 101 including the circuit formation section 102. FIG. 10 is a cross-sectional view illustrating a main portion of the organic EL panel 100, in which the organic EL element section 1000 is enlarged.

FIG. 10 illustrates the first electrode 103 (lower electrode serving as cathode or anode) formed on the circuit formation section 102, a bank 104 provided so as to cover a pattern end of the first electrode 103, organic layers 105 to 107, a second electrode 108 (upper electrode serving as anode or cathode), SiN$_x$O$_y$ films 110a and 110b, a magnesium oxide film 111, and a resin sheet 112. The organic EL element section 1000 includes the first electrode 103, the organic layers 105 to 107, and the second electrode 108.

According to this embodiment, the protective film 113 functions as a buffer, and hence it is possible to prevent generation of a black spot caused by the contact of the sealing glass 114 with the organic EL element section 1000, which has been a drawback of hollow sealing. Because the drying agent 115 is provided within the sealing space 117 and the barrier property of the protective film 113 against moisture is high, the life property of the organic EL panel of this embodiment is significantly higher than that of the conventional hollow sealing organic EL panel.

It should be noted that as long as the life property and the mechanical strength required for the organic EL panel are satisfied, no trouble occurs even if any of the magnesium oxide film 111, the SiN$_x$O$_y$ film 110b, the resin sheet 112, and the drying agent 115 is omitted.

Embodiment 4

This embodiment is substantially similar to Embodiment 3, and is different from Embodiment 3 only in that the entire surface of a region of the sealing glass 114 facing the organic EL element section 1000 is provided with the drying agent 115.

Figure 11:
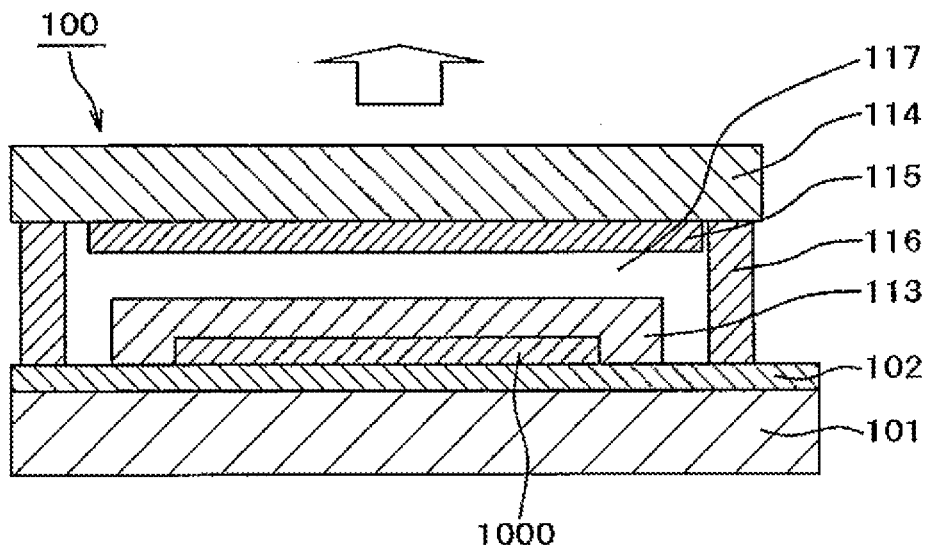
FIG. 11 is a cross-sectional view illustrating an organic EL display device according to Embodiment 4.
Figure 12:
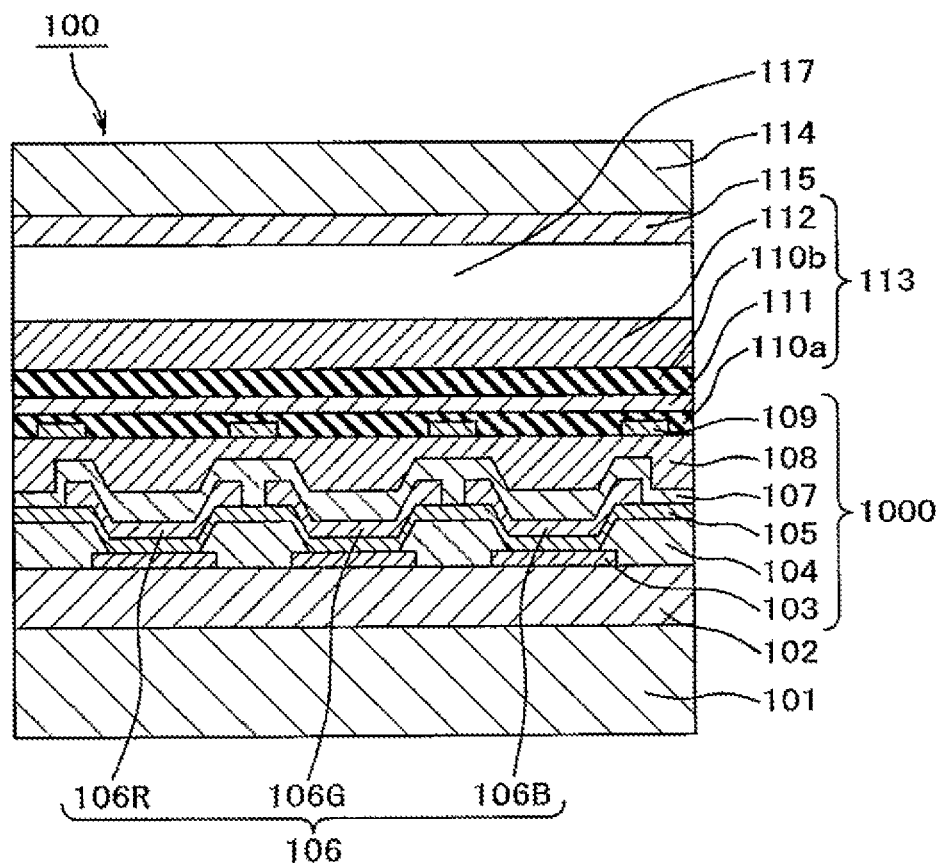
FIG. 12 is a cross-sectional view illustrating a display region of the organic EL display device according to Embodiment 4.

FIG. 11 is a cross-sectional view illustrating a main portion of the organic EL panel 100, and FIG. 12 is a cross-sectional view illustrating a main portion of the organic EL panel 100, in which the organic EL element section 1000 is enlarged. Except that the water-absorbing capability provided by the drying agent 115 is increased as compared with Embodiment 3, the constituent elements and other features of this embodiment are similar to those of Embodiment 3. Accordingly, the effects similar to those of Embodiment 3 may be obtained.

Embodiment 5

Figure 13:
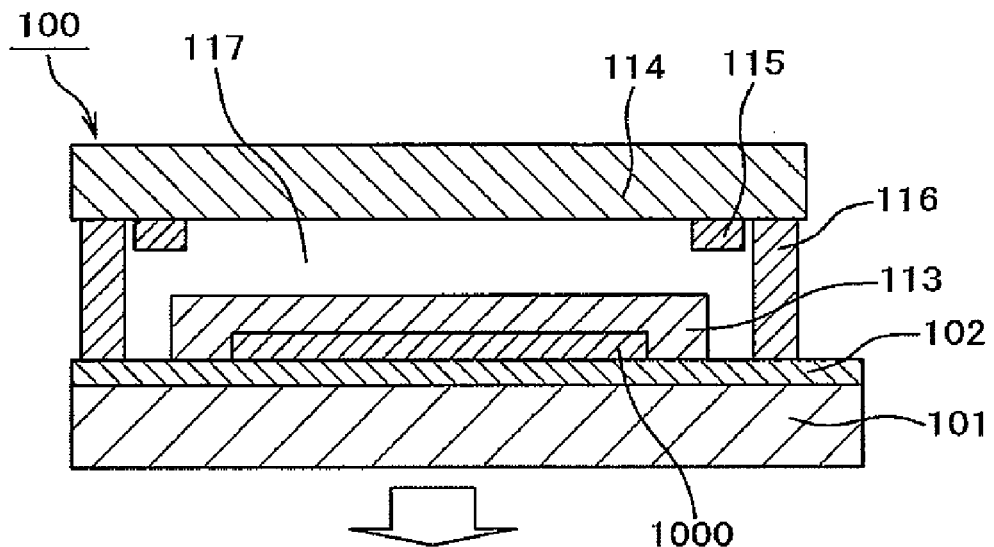
FIG. 13 is a cross-sectional view illustrating an organic EL display device according to Embodiment 5.

This embodiment provides an example of application of the present invention to a bottom emission type organic EL panel in which hollow sealing is provided. This embodiment is similar to Embodiment 2 except that hollow sealing is provided, and is similar to Embodiment 3 except that this embodiment is intended for a bottom emission type organic EL panel. FIG. 13 is a cross-sectional view illustrating a main portion of the organic EL panel 100.

In FIG. 13, the organic EL panel 100 includes a circuit board 101 such as a glass substrate; a circuit formation section 102 including a thin film transistor (TFT); an organic EL element section 1000 having an organic EL element formed thereon; a protective film 113 formed so as to cover the organic EL element section 1000; a sealing glass 114; a drying agent 115; and a sealing agent 116. The outline arrow indicates the direction of light emission, and in a case of this embodiment, light is to be taken out from the circuit board 101 side. The organic EL element section 1000 is sealed with the sealing glass 114, the protective film 113, the sealing agent 116, and the circuit board 101 including the circuit formation section 102.

Figure 14:
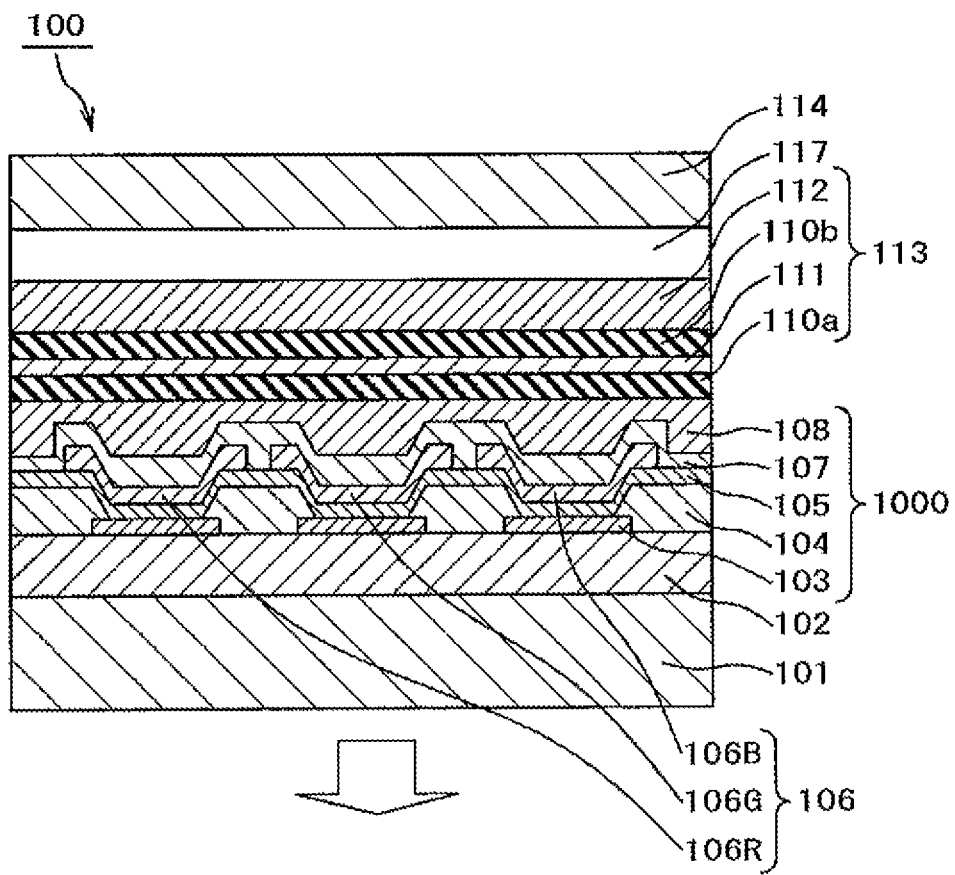
FIG. 14 is a cross-sectional view illustrating a display region of the organic EL display device according to Embodiment 5.

FIG. 14 is a cross-sectional view illustrating a main portion of the organic EL panel 100, in which the organic EL element section 1000 is enlarged. In FIG. 14, the organic EL element section 1000 includes a first electrode 103 (lower electrode serving as cathode or anode) formed on a circuit formation section 102; a bank 104 provided so as to cover a pattern end of the first electrode 103; an organic layers 105 to 107; a second electrode 108 (upper electrode serving as anode or cathode); SiN$_x$O$_y$ films 110a and 110b; a magnesium oxide film 111; and a resin sheet 112. The organic EL element section 1000 includes the first electrode 103, the organic layers 105 to 107, and the second electrode 108.

Light emitted from the organic EL panel 100 is taken out from the circuit board 101 side, and hence the first electrode 103 serves as a transparent electrode and includes an ITO film, an IZO film and/or a ZnO film. For the second electrode 108, a metal film of Al or the like is used in order to allow the second electrode 108 to function as a reflecting electrode. Therefore, there is no need to provide any auxiliary electrode. This embodiment differs in this point from Embodiment 3.

Accordingly, the protective film 113 described with reference to FIG. 13 is formed by a multilayer film of the SiN$_x$O$_y$ film 110a, the magnesium oxide film 111, the SiN$_x$O$_y$ film 110b, and the resin sheet 112, and this embodiment is also similar to Embodiment 3 in that the present invention is applied to this portion.

Also in this embodiment, it is apparent that the effects similar to those of Embodiment 2 and Embodiment 3 may be obtained.

Embodiment 6

Figure 15:
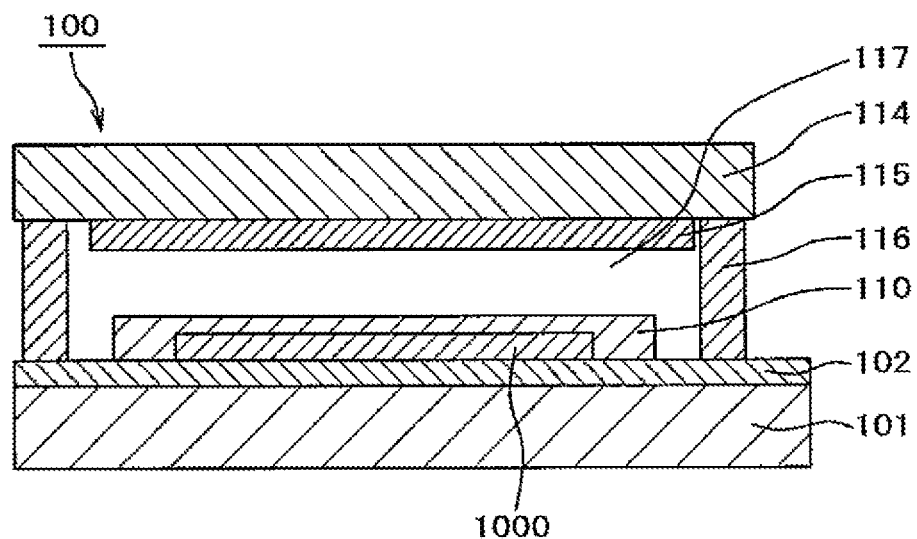
FIG. 15 is a cross-sectional view illustrating an organic EL display device according to Embodiment 6.
Figure 16:
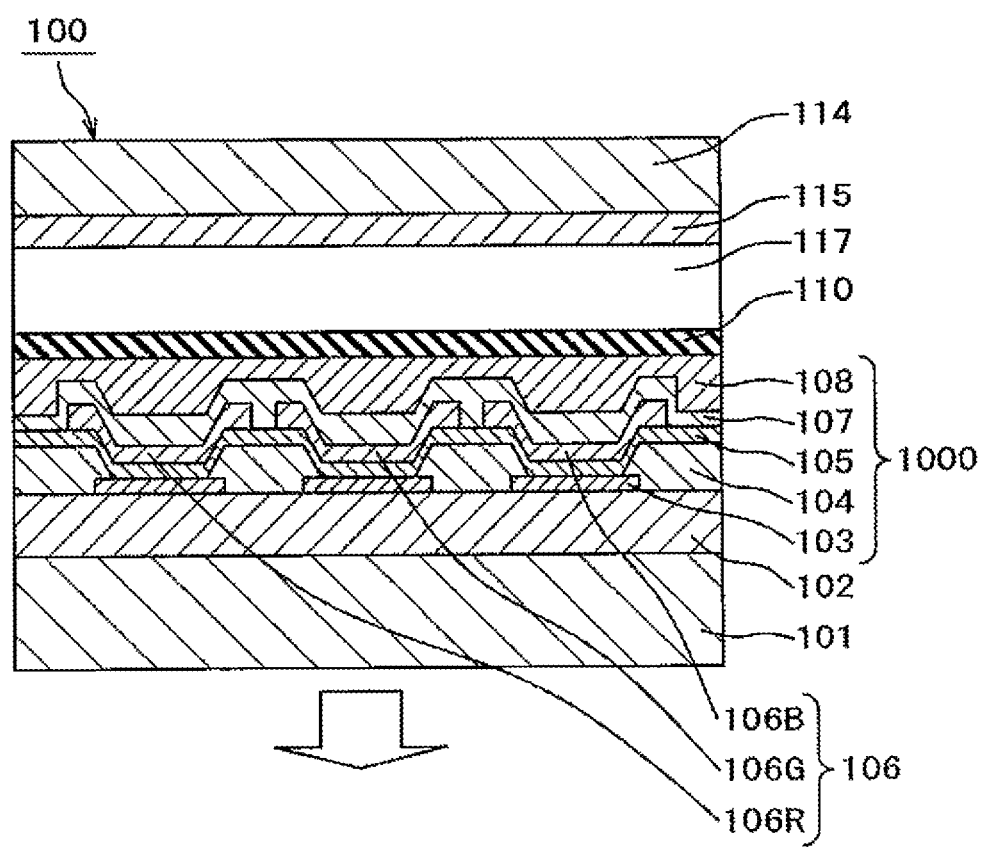
FIG. 16 is a cross-sectional view illustrating a display region of the organic EL display device according to Embodiment 6.

This embodiment is substantially similar to Embodiment 5, and is different from Embodiment 5 only in that the entire surface of a region of the sealing glass 114 facing the organic EL element section 1000 is provided with the drying agent 115. FIG. 15 is a cross-sectional view illustrating a main portion of an organic EL panel 100, and FIG. 16 is a cross-sectional view illustrating a main portion of the organic EL panel 100, in which the organic EL element section 1000 is enlarged.

Except that the water-absorbing capability provided by the drying agent 115 is increased as compared with Embodiment 5, the constituent elements and other features of this embodiment are similar to those of Embodiment 5. Accordingly, the effects similar to those of Embodiment 5 may be obtained.

While there have been described what are at present considered to be certain embodiments of the invention, it will be understood that various modifications may be made thereto, and it is intended that the appended claims cover all such modifications as fall within the true spirit and scope of the invention.

What is claimed is:

1. An organic EL display device comprising an organic EL element comprising a first electrode, an organic layer including a light emitting layer, and a second electrode, which are sequentially laminated above a first substrate having a circuit formed thereon, the organic EL element being covered with a protective layer including a silicon oxynitride film,
    wherein the silicon oxynitride film is brought into contact with the second electrode, and
    wherein the silicon oxynitride film has infrared absorption characteristics including:
    a Si—O—Si stretching vibration absorption peak appearing at energy lower than 1,000 $cm^{-1}$;
    an absorption intensity of a Si—N stretching vibration absorption peak appearing in the vicinity of around 870 $cm^{-1}$, which is 0.75 or more times the absorption intensity of the Si—O—Si stretching vibration absorption peak; and
    an absorption peak intensity in a range of 2,000 to 4,000 $cm^{-1}$, which is 5% or less of the absorption intensity of the Si—N stretching vibration absorption peak.

2. An organic EL display device according to claim 1, wherein the protective layer including the silicon oxynitride film is fabricated by reactive plasma deposition (RPD), sputtering, or activated reactive evaporation CVD.

3. An organic EL display device according to claim 2, wherein the silicon oxynitride film contains at least one material selected from the group consisting of Ar, Ne, and He.

4. An organic EL display device according to claim 2, wherein the protective layer comprises a magnesium oxide film laminated on the silicon oxynitride film.

5. An organic EL display device according to claim 2, wherein the protective layer comprises a magnesium oxide film laminated on the silicon oxynitride film, and another silicon oxynitride film laminated on the magnesium oxide film.

6. An organic EL display device according to claim 4, wherein the magnesium oxide film contains at least one material selected from the group consisting of Ar, Ne, and He.

7. An organic EL display device according to claim 4, wherein a value determined by dividing an absorbance log (1/transmittance) at an O—H vibration absorption peak, which is observed in a range of 3,400 to 3,500 $cm^{-1}$ and in the vicinity of 3600 $cm^{-1}$ in an infrared absorption spectrum of the magnesium oxide film, by a film thickness of the magnesium oxide film is equal to or less than 0.08 $\mu m^{-1}$.

8. An organic EL display device according to claim 4, wherein a value determined by dividing an absorbance log (1/transmittance) at an Mg—OH vibration absorption peak, which is observed in the vicinity of 3,700 $cm^{-1}$ in an infrared absorption spectrum of the magnesium oxide film, by a film thickness of the magnesium oxide film is equal to or less than 0.08 $\mu m^{-1}$.

9. An organic EL display device according to claim 4, wherein the magnesium oxide film has a (111) crystalline orientation, and in an X-ray diffraction spectrum, a ratio between a (200) diffraction peak intensity I (200) and a (111) diffraction peak intensity I (111), i.e., I (200)/I (111), is equal to or less than 1.

10. An organic EL display device according to claim 4, wherein the magnesium oxide film has an O/Mg ratio of equal to or more than 0.95 and equal to or less than 1.1.

11. An organic EL display device comprising an organic EL element comprising a first electrode, an organic layer including a light emitting layer, and a second electrode, which are sequentially laminated above a first substrate having a circuit formed thereon, the organic EL element being covered with a protective layer including silicon oxynitride film,
    wherein the silicon oxynitride film is brought into contact with the second electrode,
    wherein the silicon oxynitride film has infrared absorption characteristics including:
    Si—O—Si stretching vibration absorption peak appearing at energy lower than 1,000 $cm^{-1}$;
    an absorption intensity of a Si—N stretching vibration absorption peak appearing in the vicinity of around 870 $cm^{-1}$, which is 0.75 or more times the absorption intensity of the Si—O—Si stretching vibration absorption peak; and
    an absorption peak intensity in a range of 2,000 to 4,000 $cm^{-1}$, which is 5% or less of the absorption intensity of the Si—N stretching vibration absorption peak, and
    wherein the organic EL display device further comprises a resin sheet laminated on the protective layer, and a second substrate laminated on the resin sheet.

12. An organic EL display device according to claim 11, wherein the protective layer including the silicon oxynitride film is fabricated by reactive plasma deposition (RPD) or activated reactive evaporation CVD.

13. An organic EL display device according to claim 12, wherein the resin sheet has a water-absorbing property.

14. An organic EL display device according to claim 12, wherein the second substrate is transparent with respect to visible light.

15. An organic EL display device comprising an organic EL element comprising a first electrode, an organic layer including a light emitting layer, and a second electrode, which are sequentially laminated above a first substrate having a circuit formed thereon, the organic EL element being covered with a protective layer including silicon oxynitride film,
    wherein the silicon oxynitride film is brought into contact with the second electrode, and the film has infrared absorption characteristics including:
    a Si—O—Si stretching vibration absorption peak appearing at energy lower than 1,000 $cm^{-1}$;
    an absorption intensity of a Si—N stretching vibration absorption peak appearing in the vicinity of around 870 $cm^{-1}$, which is 0.75 or more times the absorption intensity of the Si—O—Si stretching vibration absorption peak; and
    an absorption peak intensity in a range of 2,000 to 4,000 $cm^{-1}$, which is 5% or less of the absorption intensity of the Si—N stretching vibration absorption peak, and
    wherein the organic EL display device further comprises a resin sheet laminated on the protective layer, the resin sheet is covered with a second substrate with a space interposed therebetween, and the space is filled with an inert gas.

16. An organic EL display device according to claim 15, wherein the protective layer including the silicon oxynitride film is fabricated by reactive plasma deposition (RPD) or activated reactive evaporation CVD.

17. An organic EL display device according to claim 16, wherein the inert gas comprises nitrogen.

18. An organic EL display device according to claim 16, further comprising a drying agent between the first substrate and the second substrate.

19. An organic EL display device according to claim 16, wherein the second substrate is transparent with respect to visible light.

20. A method of manufacturing an organic EL display device comprising an organic EL element comprising a first electrode, an organic layer including a light emitting layer, and a second electrode, which are sequentially laminated above a first substrate having a circuit formed thereon, the organic EL element being covered with a protective layer including a silicon oxynitride film, which is fabricated by a reactive plasma deposition (RPD) or an activated reactive evaporation CVD, the method comprising irradiating a material made of a silicon oxide with an ion beam in an atmosphere containing at least one material selected from the group consisting of Ar, Ne, He and $H_2$ and a nitrogen compound gas, to form the silicon oxynitride film.

21. A method of manufacturing an organic EL display device comprising an organic EL element comprising a first electrode, an organic layer including a light emitting layer, and a second electrode, which are sequentially laminated above a first substrate having a circuit formed thereon, the organic EL element being covered with a protective layer including a silicon oxynitride film and a magnesium oxide film, which is fabricated by a method of a reactive plasma deposition (RPD) or an activated reactive evaporation CVD, the method comprising irradiating a material made of a magnesium oxide with one of an ion beam and an electron beam in an atmosphere containing an oxygen compound gas to form the magnesium oxide film.

* * * * *